(12) United States Patent
Cheng et al.

(10) Patent No.: US 7,022,622 B2
(45) Date of Patent: Apr. 4, 2006

(54) METHOD AND STRUCTURE TO IMPROVE PROPERTIES OF TUNABLE ANTIREFLECTIVE COATINGS

(75) Inventors: Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 10/710,409

(22) Filed: Jul. 8, 2004

(65) Prior Publication Data
US 2006/0009027 A1 Jan. 12, 2006

(51) Int. Cl.
*H01L 21/31* (2006.01)
*H01L 21/469* (2006.01)

(52) U.S. Cl. .................................... 438/781

(58) Field of Classification Search ............. 438/781
See application file for complete search history.

(56) References Cited

U.S. PATENT DOCUMENTS

| | | | |
|---|---|---|---|
| 6,147,009 A | 11/2000 | Grill et al. | |
| 6,316,167 B1 | 11/2001 | Angelopoulos et al. | |
| 6,436,799 B1* | 8/2002 | Ramkumar et al. | 438/530 |
| 6,465,366 B1 | 10/2002 | Nemani et al. | |
| 6,514,667 B1 | 2/2003 | Angelopoulos et al. | |
| 6,531,398 B1* | 3/2003 | Gaillard et al. | 438/692 |
| 6,537,733 B1 | 3/2003 | Nemani et al. | |
| 6,579,630 B1* | 6/2003 | Li et al. | 428/690 |
| 6,635,583 B1 | 10/2003 | Bencher et al. | |
| 6,703,169 B1 | 3/2004 | Fuller et al. | |
| 2003/0008244 A1* | 1/2003 | Khanarian et al. | 430/321 |

* cited by examiner

*Primary Examiner*—Asok Kumar Sarkar
(74) *Attorney, Agent, or Firm*—Lisa U. Jaklitsch

(57) ABSTRACT

A method for improving the properties of tunable etch resistant anti-reflective coatings (TERA) is disclosed. The method includes annealing the deposited layer of TERA in an environment containing at least one of hydrogen and deuterium. The annealed layer has an increased concentration of hydrogen and/or deuterium as compared to the deposited film, and may also have an additional concentration of hydrogen or deuterium at the interface between the substrate and the layer of TERA.

19 Claims, 4 Drawing Sheets

METHOD AND STRUCTURE TO IMPROVE PROPERTIES OF TUNABLE ANTIREFLECTIVE COATINGS

BACKGROUND OF INVENTION

The present invention is directed to structures and methods useful for fabricating integrated circuits (ICs), in particular structures having a plurality of interconnect layers. More particularly, the present invention is directed to a method for improving the properties of tunable vapor deposited materials which function as antireflective coatings and/or as hardmasks for high resolution lithography.

The semiconductor industry continues to require devices with an increased device density and a concomitant decrease in device geometry. The continuous size reduction of the critical dimension (CD) of semiconductor devices creates an increasing challenge to balance the need for efficient etch resistance (i.e. resist thickness) with the demands of production-worthy depth-of-focus (DOF). Resist thickness is continuously thinned to accommodate reduced DOF which results from use of tools with higher numerical aperture (NA). As the thickness of the resist is decreased, the resist becomes less effective as a mask for subsequent dry etch image transfer to the underlying substrate, i.e. most if not all of the resist is etched away during the subsequent pattern transfer process. Without significant improvement in the etch selectivity exhibited by current single layer resists (SLR), these systems can not provide the necessary lithographic and etch properties for high resolution lithography.

Another problem with single layer resist systems is critical dimension (CD) control. Substrate reflections at ultraviolet (UV) and deep ultraviolet (DUV) wavelengths are notorious to produce standing wave effects and resist notching which severely limit CD control of single layer resists. Notching results from substrate topography and nonuniform substrate reflectivity which causes local variations in exposure energy on the resist. Standing waves are thin film interference (TFI) or periodic variations of light intensity through the resist thickness. These light variations are introduced because planarization of the resist presents different thickness through the underlying topography. Thin film interference plays a dominant role in CD control of single layer photoresist processes, causing large changes in the effective exposure dose due to a tiny change in optical phase.

Various antireflective coating (ARC) and hardmask materials have been developed to alleviate these problems of etch resistance and substrate reflections. Such materials include the tunable vapor deposited materials described in U.S. Pat. No. 6,316,167, the disclosure of which is incorporated herein by reference. These tunable materials have the composition R:C:H:X, wherein R is selected from Si, Ge, B, Sn, Fe, Ti and mixtures of these elements, and X is selected from O, N, S, F and mixtures of these elements, and X is optionally present. These materials will be referred to as tunable etch resistant ARC, or TERA. Compared to other hardmask materials such as polysilicon, TERA exhibits excellent etch selectivity to resist and to oxide. Selectivity of 1:2.5 to resist and 7:1 to oxide has been demonstrated. TERA is also envisioned as an antireflective layer, so no additional ARC is required for lithography processes using TERA. Thus, the mask open process is simplified, resulting in cost reduction.

However, lithography processes using TERA have been found to suffer from a large variation of CD post lithography, which limits a successful implementation of TERA as hardmask. The CD variation is attributed to the non-uniformity of as-deposited TERA properties across the wafer. Thus, there is a need in the art for a method to improve TERA uniformity and reduce CD variation across the wafer.

SUMMARY OF INVENTION

The aforementioned deficiencies of the prior art are alleviated through use of the method of the present invention. Specifically, the present invention is directed to a method for improving TERA uniformity by annealing a wafer comprising a TERA film in an environment comprising hydrogen or deuterium, an isotope of hydrogen. Up to 40% CD variation reduction on TERA wafers is demonstrated.

The present invention is specifically directed to a method comprising: depositing on a surface of a substrate a layer formed of a material; and annealing the layer in an environment comprising at least one of hydrogen and deuterium, thereby forming an annealed layer. The material comprises carbon, at least one of hydrogen and deuterium, and at least one element selected from the group consisting of Si, Ge, B, Sn, Fe and Ti. The material may further comprise at least one element selected from the group consisting of O, N, S and F.

The present invention is also directed to a lithographic structure comprising a plurality of layers, at least one layer being formed of a material comprising carbon, deuterium, and at least one element selected from the group consisting of Si, Ge, B, Sn, Fe and Ti. The material may further comprise at least one element selected from the group consisting of O, N, S and F, and also may further comprise hydrogen.

BRIEF DESCRIPTION OF DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION

The invention will now be described by reference to the accompanying figures. In the figures, various aspects of the structures have been shown and schematically represented in a simplified manner to more clearly describe and illustrate the invention. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

The invention is directed to a method to improve the uniformity of a film such as TERA, thus improving the lithography and etching performance of the film by annealing the deposited film in an environment containing hydrogen or deuterium.

A preferred embodiment of the method of this invention is illustrated in FIGS. 1(a)–1(d). The method begins in FIG. 1(a) with a substrate 10 which may be, for example, a bare silicon wafer, a wafer containing one or more layers of other materials, or a wafer containing various device structures.

Figure 1A:
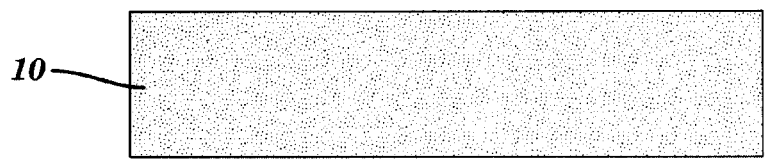
FIGS. 1(a)–1(d) illustrate a preferred embodiment of the method of the present invention.
Figure 1B:
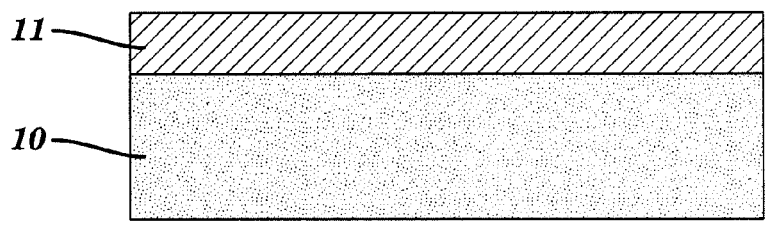

In FIG. 1(b), a layer 11 of a material such as TERA is deposited on substrate 10. In general, the layer 11 may be formed of a material such as the tunable vapor deposited materials described in U.S. Pat. No. 6,316,167, the disclosure of which has been incorporated herein by reference. These tunable vapor deposited materials have a structural formula R:C:H:X, wherein R is selected from the group consisting of Si, Ge, B, Sn, Fe, Ti and combinations thereof, and wherein X is not present or is selected from the group consisting of one or more of O, N, S and F. Alternatively, layer 11 may be formed of a material having a structural formula R:C:H:D:X or R:C:D:X, where R and X are as defined above, and D is deuterium.

Layer 11 may be deposited by any suitable method, including the methods described in U.S. Pat. No. 6,316,167, the disclosure of which has been incorporated herein by reference. For example, layer 11 may be deposited by plasma enhanced chemical vapor deposition (PECVD) techniques. In one type of technique the PECVD process is performed in a parallel plate reactor where the substrate is placed on one of the electrodes. Various exemplary deposition embodiments are disclosed in U.S. Pat. No. 6,316,167.

When layer 11 is formed of a material having structural formula R:C:H:X, each component is preferably present in the following amounts. The preferred atomic % ranges for R are the following: preferably 0% to 95%, more preferably 0.5% to 95%, most preferably 1 to 60% and most highly preferably 5 to 50%. The preferred atomic % ranges for C are the following: preferably 0% to 95%, more preferably 0.5% to 95%, most preferably 1 to 60% and most highly preferably 5 to 50%. The preferred atomic % ranges for H are the following: preferably 0% to 50%, more preferably 0.5% to 50%, most preferably 1 to 40% and most highly preferably 5 to 30%. The preferred atomic % ranges for X are the following: preferably 0% to 70%, more preferably 0.5% to 70%, most preferably 1 to 40% and most highly preferably 5 to 30%.

Alternatively, some or all of the hydrogen in the R:C:H:X material may be replaced with deuterium, such that layer 11 is formed of a material having structural formula R:C:H:D:X or R:C:D:X. Layer 11 containing deuterium may be formed by using a precursor material containing deuterium in place of some or all of the hydrogen.

Figure 1C:
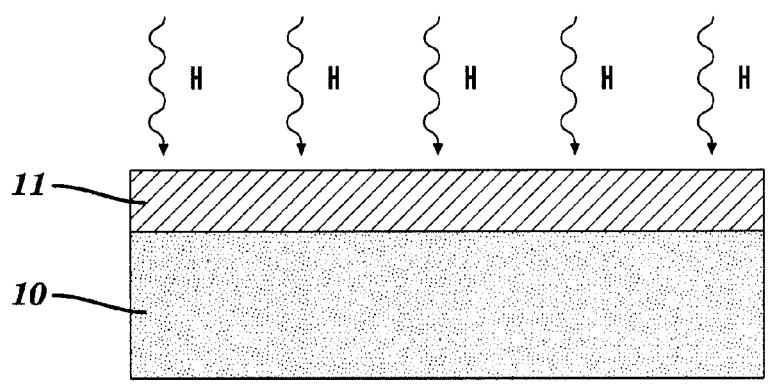

The method of this invention continues with layer 11 being annealed in an environment containing hydrogen or deuterium. In FIG. 1(c), the annealing step is shown in an environment containing hydrogen. In an alternative embodiment, the annealing step may be performed in an environment containing deuterium. The annealing environment preferably contains 0.1% to 100% hydrogen and/or deuterium. One or more other gases such as, for example, nitrogen, helium, neon or argon, may be present in the annealing environment.

The annealing temperature is preferably 350° C. to 500° C., more preferably 380° C. to 450° C., and most preferably 400° C. to 425° C. The annealing duration is preferably 1 min. to 100 min., more preferably 10 min. to 60 min., and most preferably 30 min.

Figure 2A:
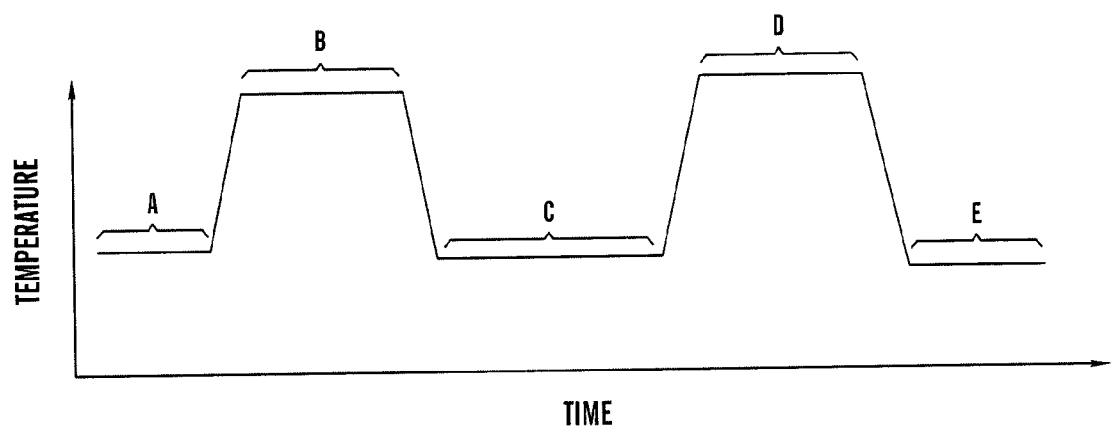
FIGS. 2(a)–2(b) illustrate two alternate embodiments for the annealing step of the present invention.
Figure 2B:
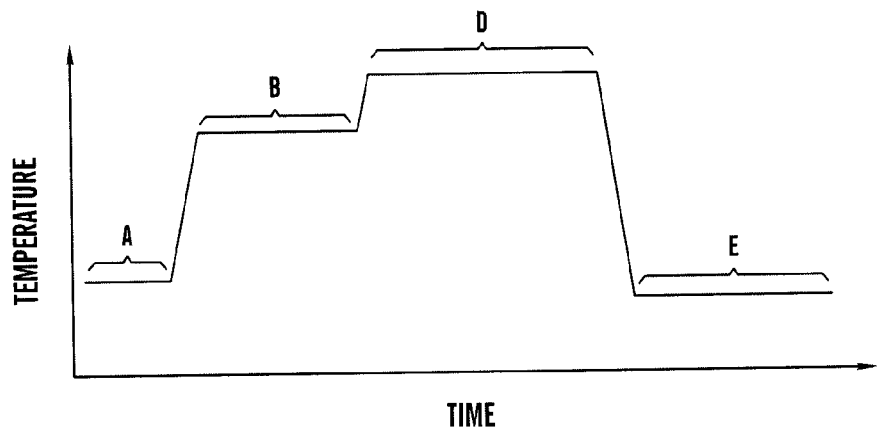

The annealing process may be performed as a separate step after deposition. Alternatively, the annealing may be performed in situ, i.e., in the same chamber as the deposition process. These two embodiments are illustrated in FIGS. 2(a) and 2(b), which are graphs of the wafer temperature versus time during the method of this invention. A represents the temperature of the substrate prior to deposition of layer 11, B represents an elevated temperature typically encountered in a deposition chamber during deposition of layer 11, C represents a lowered temperature of the wafer as the wafer is transferred from the deposition chamber to another chamber or furnace for annealing, D represents an elevated temperature during anneal, and E represents a lowered temperature of the wafer which is ready for further processing. In FIG. 2(a), the annealing process is performed in a separate chamber or furnace, whereas in FIG. 2(b), deposition and annealing are performed in an integrated process in the same chamber or tool.

Figure 1D:
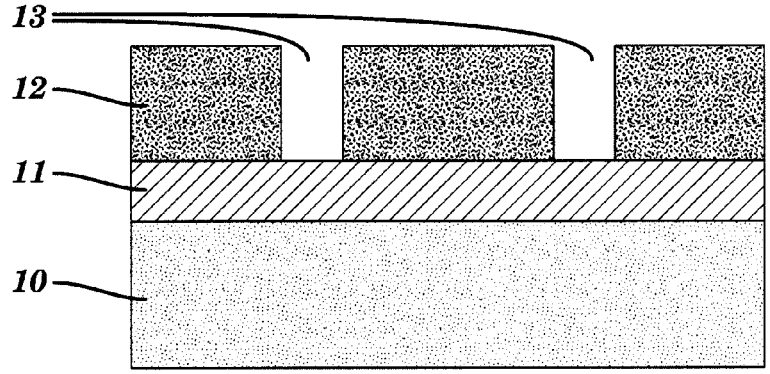

Following anneal of layer 11, processing of the wafer may continue. For example, as shown in FIG. 1(d), photoresist 12 may be deposited on layer 11 and patterned using a conventional lithography process to form openings 13.

The method of this invention produces a new film structure containing additional hydrogen and/or deuterium as compared to the deposited film. For example, when deposited layer 11 is formed of a material having structural formula R:C:H:X, and layer 11 is annealed in an environment containing hydrogen, the preferred atomic % ranges for H are the following: preferably 2% to 70%, more preferably 20% to 60%, and most preferably 30 to 50%. Alternatively, when deposited layer 11 is formed of a material having structural formula R:C:H:X, and layer 11 is annealed in an environment containing deuterium, the preferred atomic % ranges for D are the following: preferably 2% to 70%, more preferably 10% to 40%, and most preferably 20 to 30%. In yet another alternative embodiment, when deposited layer 11 is formed of a material having structural formula R:C:D:X, and layer 11 is annealed in an environment containing deuterium, the preferred atomic % ranges for D are the following: preferably 2% to 70%, more preferably 20% to 60%, and most preferably 30 to 50%.

Figure 3:
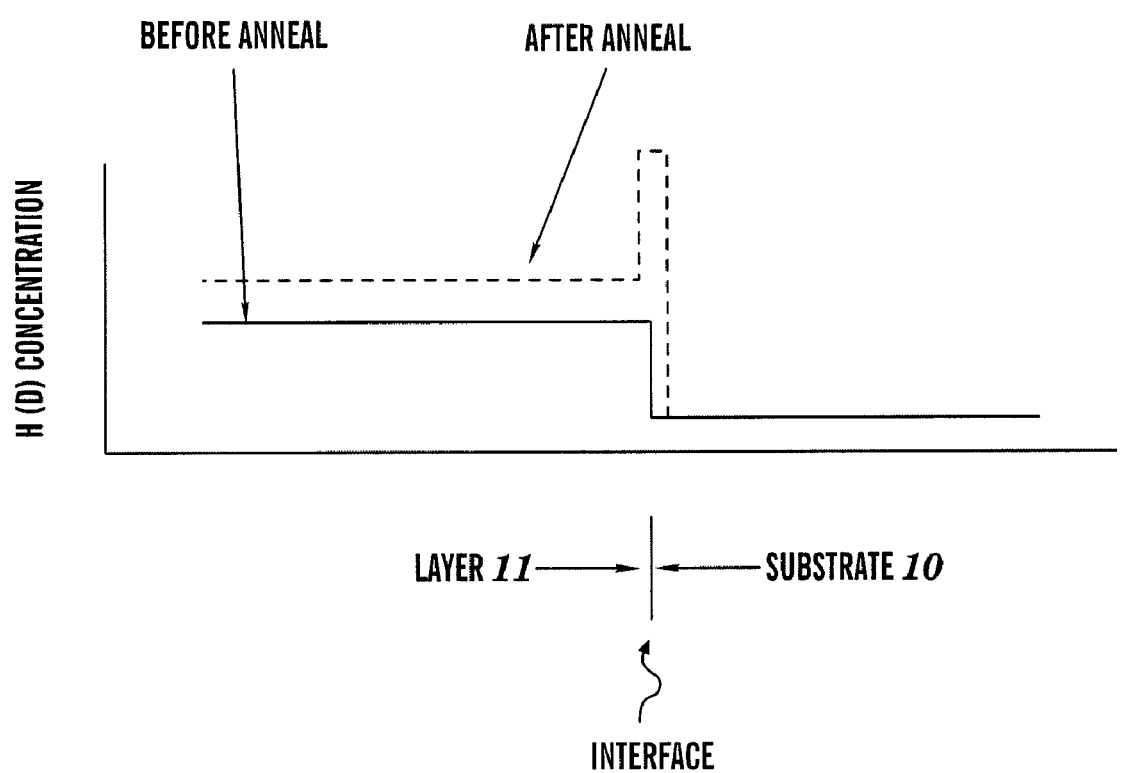
FIG. 3 illustrates an embodiment of annealed layer of the present invention.

Moreover, annealed layer 11 may have an additional concentration of hydrogen or deuterium at the interface between substrate 10 and layer 11. FIG. 3 illustrates an exemplary profile of H or D concentration across layer 11 and substrate 10. The solid line represents one possible H or D profile before anneal, and the dotted line represents another possible profile after anneal showing a peak H or D concentration at the interface between layer 11 and substrate 10 due to the accumulation of H or D at the sites of interface defects.

The following example is provided to illustrate the scope of the invention. Because this example is given for illustrative purposes only, the invention embodied therein should not be limited thereto.

Figure 4A:
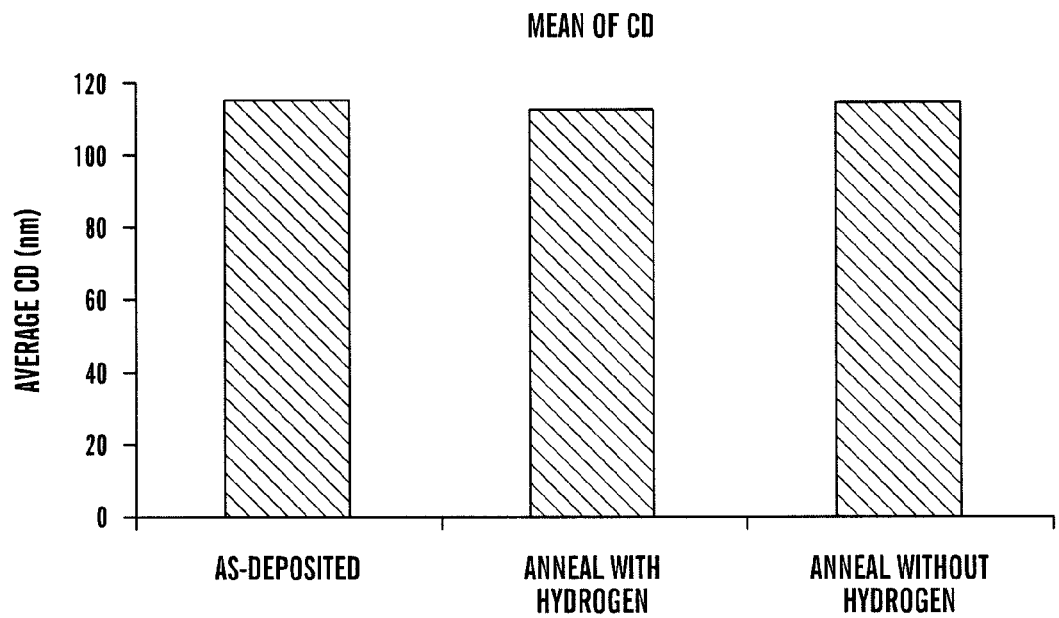
FIGS. 4(a)–4(b) illustrate the results of an example of the present invention.
Figure 4B:
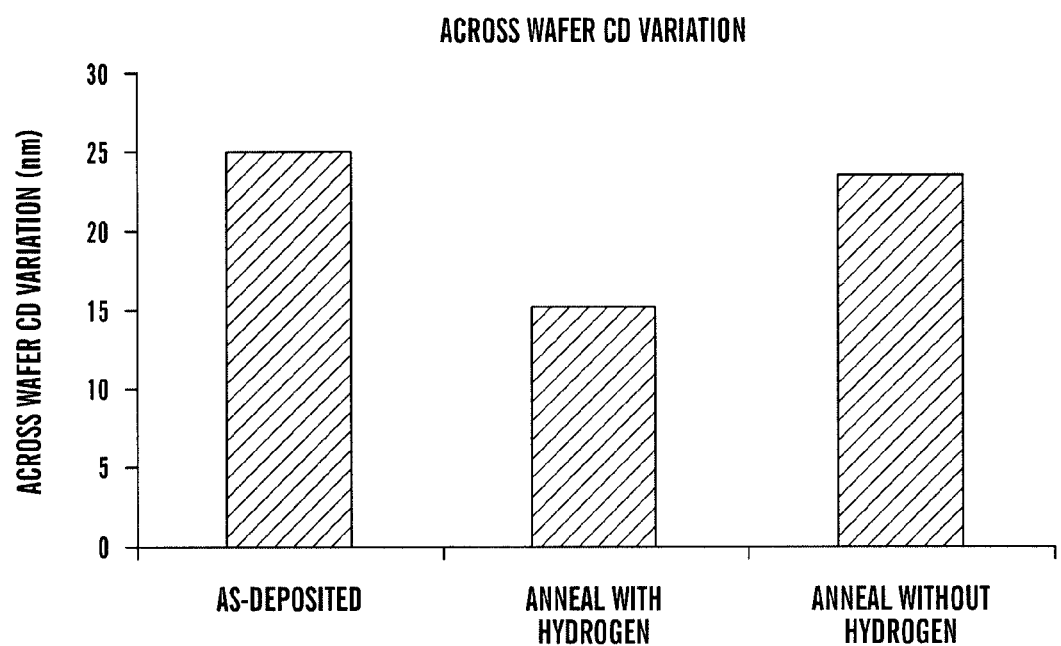

Example: About 2000 Å of a TERA film was deposited on a set of silicon wafers with 53 Å pad oxide, 1800 Å pad nitride, and 15000 Å borosilicate glass (BSG) oxide. The wafers were then divided into three groups. The first group of the wafers was annealed in a furnace containing 10% hydrogen and 90% nitrogen, and the second group of the wafers was annealed in the same furnace with 100% nitrogen. The annealing temperature was 400° C. and the annealing duration was 30 min. The third group of wafers, which was used as a control group, was not annealed. After the annealing step, all wafers were then subjected to the same lithography process. The photoresist layer had a thickness of approximately 3500 Å after deposition and approximately 3000 Å after exposure. The critical dimensions (CDs) of these three groups were then measured and results are compared in FIG. 4. FIG. 4(a) shows that the mean CD is very close for all wafers regardless of annealing. This indicates that there is no need to change the lithography process when the annealing process is added. FIG. 4(b) shows that the across-wafer CD variation is reduced from about 25 nm without annealing to about 15 nm with annealing in the environment containing hydrogen. Virtually no change in CD variation was observed with annealing in the environment containing only nitrogen. The reduction of CD variation is attributed to the improved TERA uniformity by annealing in an environment containing hydrogen.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A method comprising:
    depositing on a surface of a substrate a layer formed of a material comprising carbon, hydrogen, deuterium and at least one element selected from the group consisting of Si, Ge, B, Sn, Fe and Ti; and
    annealing said layer in an environment comprising at least one of hydrogen and deuterium, thereby forming an annealed layer.

2. The method of claim 1, wherein said material further comprises at least one element selected from the group consisting of O, N, S and F.

3. The method of claim 2, wherein said material comprises carbon in an amount of about 0.5 to 95 atomic %, hydrogen in an amount of about 0.5 to 50 atomic %, at least one element selected from the group consisting of Si, Ge, B, Sn, Fe and Ti in an amount of about 0.5 to 95 atomic %, and at least one element selected from the group consisting of O, N, S and F in an amount of about 0.5 to 70 atomic %.

4. The method of claim 2, wherein said material comprises carbon in an amount of about 1 to 60 atomic %, hydrogen in an amount of about 1 to 40 atomic %, at least one element selected from the group consisting of Si, Ge, B, Sn, Fe and Ti in an amount of about 1 to 60 atomic %, and at least one element selected from the group consisting of O, N, S and F in an amount of about 1 to 40 atomic %.

5. The method of claim 2, wherein said material comprises carbon in an amount of about 5 to 50 atomic %, hydrogen in an amount of about 5 to 30 atomic %, at least one element selected from the group consisting of Si, Ge, B, Sn, Fe and Ti in an amount of about 5 to 50 atomic %, and at least one element selected from the group consisting of O, N, S and F in an amount of about 5 to 30 atomic %.

6. The method of claim 1, wherein said layer is deposited by a plasma enhanced chemical vapor deposition (PECVD) process.

7. The method of claim 6, wherein said PECVED process is performed in a parallel plate reactor wherein said substrate is placed on an electrode of the reactor.

8. The method of claim 1, wherein said annealing environment contains at least one of hydrogen and deuterium in an amount of about 0.1 to 100%.

9. The method of claim 1, wherein said annealing is performed at a temperature of about 350° C. to 500° C. and for a duration of about 1 min. to 100 min.

10. The method of claim 1, wherein said annealing is performed at a temperature of about 380° C. to 450° C. and for a duration of about 10 min. to 60 min.

11. The method of claim 1, wherein said annealing is performed at a temperature of about 400° C. to 425° C. and for a duration of about 30 min.

12. The method of claim 1, wherein said depositing step is performed in a first chamber, and said annealing step is performed in a second chamber different from said first chamber.

13. The method of claim 1, wherein said depositing step is performed in a chamber, and said annealing step is performed in the same chamber.

14. The method of claim 1, wherein said layer is annealed in an environment comprising hydrogen, and said annealed layer comprises hydrogen in an amount of about 20 to 60 atomic %.

15. The method of claim 1, wherein said layer is annealed in an environment comprising hydrogen, and said annealed layer comprises hydrogen in an amount of about 30 to 50 atomic %.

16. The method of claim 1, wherein said layer is annealed in an environment comprising deuterium, and said annealed layer comprises deuterium in an amount of about 10 to 40 atomic %.

17. The method of claim 1, wherein said layer is annealed in an environment comprising deuterium, and said annealed layer comprises deuterium in an amount of about 20 to 30 atomic %.

18. The method of claim 1, wherein said annealed layer comprises at least one of hydrogen and deuterium in a concentration which is greater at an interface with said substrate than at other portions of the layer.

19. A method comprising:
    depositing on a surface of a substrate a layer formed of a material comprising carbon, deuterium and at least one element selected from the group consisting of Si, Ge, B, Sn, Fe and Ti; and
    annealing said layer in an environment comprising at least one of hydrogen and deuterium, thereby forming an annealed layer.

* * * * *